United States Patent
Jang et al.

(10) Patent No.: US 10,388,832 B2
(45) Date of Patent: Aug. 20, 2019

(54) UV LIGHT EMITTING DIODE

(71) Applicant: SEOUL VIOSYS CO., LTD., Ansan-si (KR)

(72) Inventors: Seong Kyu Jang, Ansan-si (KR); Ji Hyeon Jeong, Ansan-si (KR); Kyu Ho Lee, Ansan-si (KR); Joon Hee Lee, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 15/969,723

(22) Filed: May 2, 2018

(65) Prior Publication Data

US 2018/0323343 A1 Nov. 8, 2018

(30) Foreign Application Priority Data

May 2, 2017 (KR) .................. 10-2017-0056447

(51) Int. Cl.
| | |
|---|---|
| *H01L 27/00* | (2006.01) |
| *H01L 33/00* | (2010.01) |
| *H01L 33/38* | (2010.01) |
| *H01L 33/40* | (2010.01) |
| *H01L 33/62* | (2010.01) |

(Continued)

(52) U.S. Cl.
CPC .......... *H01L 33/38* (2013.01); *H01L 27/156* (2013.01); *H01L 33/0025* (2013.01); *H01L 33/20* (2013.01); *H01L 33/32* (2013.01); *H01L 33/387* (2013.01); *H01L 33/405* (2013.01); *H01L 33/44* (2013.01); *H01L 33/62* (2013.01); *H01L 33/06* (2013.01); *H01L 33/145* (2013.01)

(58) Field of Classification Search
CPC .............. H01L 27/156; H01L 27/3276; H01L 27/3288; H01L 27/1225; H01L 27/124; H01L 27/15; H01L 33/38; H01L 33/0025; H01L 33/20; H01L 33/32; H01L 33/387; H01L 33/405; H01L 33/44; H01L 33/62; H01L 33/06; H01L 33/145
See application file for complete search history.

(56) References Cited

U.S. PATENT DOCUMENTS 8,829,546 B2 * 9/2014 DenBaars ............. H01L 33/025
257/103
9,117,944 B2 * 8/2015 McLaurin ............. H01L 33/007
(Continued)

*Primary Examiner* — Nikolay K Yushin
(74) *Attorney, Agent, or Firm* — Perkins Coie LLP

(57) ABSTRACT

An ultraviolet light emitting diode is provided to comprise an n-type semiconductor layer disposed on a substrate; light emitting elements disposed on the n-type semiconductor layer, each comprising an active layer and a p-type semiconductor layer; an n-type ohmic contact layer contacting the n-type semiconductor layer around the micro light emitting elements; p-type ohmic contact layers contacting the p-type semiconductor layers, respectively; an n-bump electrically connecting to the n-type ohmic contact layer; and a p-bump electrically connected to the p-type ohmic contact layers, wherein each of the n-bump and the p-bump is disposed across over a plurality of micro light emitting elements. The micro light emitting elements may be arranged over a wide area of the substrate, and thus light output can be improved and a forward voltage may be lowered, in addition, the n-bump and the p-bump may be formed relatively widely.

16 Claims, 5 Drawing Sheets

(51) Int. Cl.
*H01L 27/15* (2006.01)
*H01L 33/44* (2010.01)
*H01L 33/32* (2010.01)
*H01L 33/20* (2010.01)
*H01L 33/14* (2010.01)
*H01L 33/06* (2010.01)

(56) References Cited

U.S. PATENT DOCUMENTS

| | | | |
|---|---|---|---|
| 9,935,086 B2* | 4/2018 | Moon | H01L 25/0753 |
| 2007/0120129 A1* | 5/2007 | DenBaars | H01L 33/025 |
| | | | 257/79 |
| 2010/0072489 A1* | 3/2010 | McLaurin | H01L 33/007 |
| | | | 257/88 |
| 2017/0256520 A1* | 9/2017 | Moon | H01L 25/0753 |

* cited by examiner

UV LIGHT EMITTING DIODE

CROSS-REFERENCE TO RELATED APPLICATION(S)

This patent document claims priority to and benefit of Korean Patent Application No. 10-2017-0056447, filed May 2, 2017. The entire content of the aforementioned patent application is incorporated herein by reference as part of this patent document.

TECHNICAL FIELD

The disclosed technology relates to an inorganic semiconductor light emitting diode including an ultraviolet light emitting diode emitting deep ultraviolet light of 300 nm or less.

BACKGROUND

Generally, light emitting diodes emitting ultraviolet light in a range of 200 to 300 nm can be used for various applications including sterilization devices, water or air purification devices, high density optical recording devices, excitation sources of bio-aerosol fluorescence detection systems.

Unlike a near-ultraviolet or blue light emitting diode, a light emitting diode emitting relatively deep ultraviolet light comprises a well layer containing Al, such as AlGaN. Due to a composition of these gallium nitride based semiconductor layers, a deep ultraviolet light emitting diode has a structure significantly different from the blue light emitting diode and the near ultraviolet light emitting diode.

SUMMARY

Exemplary embodiments of the disclosed technology provide an ultraviolet light emitting diode of a new structure capable of improving electrical characteristics, and/or light output.

Exemplary embodiments of the disclosed technology provide an ultraviolet light emitting diode capable of increasing a size of a bump Exemplary embodiments of the disclosed technology provide an ultraviolet light emitting diode capable of simplifying processes by omitting a step difference adjustment layer.

An exemplary embodiment of the disclosed technology provides an ultraviolet light emitting diode comprising: a substrate; an n-type semiconductor layer disposed on the substrate; micro light emitting elements disposed on the n-type semiconductor layer and each comprising an active layer and a p-type semiconductor layer; an n ohmic contact layer contacting the n-type semiconductor layer around the micro light emitting elements; p ohmic contact layers contacting the p-type semiconductor layers of the micro light emitting elements, respectively; an n-bump electrically connecting to the n ohmic contact layer; and a p-bump electrically connected to the p ohmic contact layers of the micro light emitting elements, wherein each of the n-bump and the p-bump is disposed across over a plurality of micro light emitting elements.

The advantages and features of the disclosed technology will be discussed in detail in a detailed description or become apparent through the detailed description.

BRIEF DESCRIPTION OF THE DRAWINGS

The accompanying drawings, which are included to provide a further understanding of the disclosed technology, and are incorporated in and constitute a part of this specification, illustrate exemplary embodiments of the disclosed technology, and together with the description serve to describe the principles of the disclosed technology.

DETAILED DESCRIPTION

Figure 1:
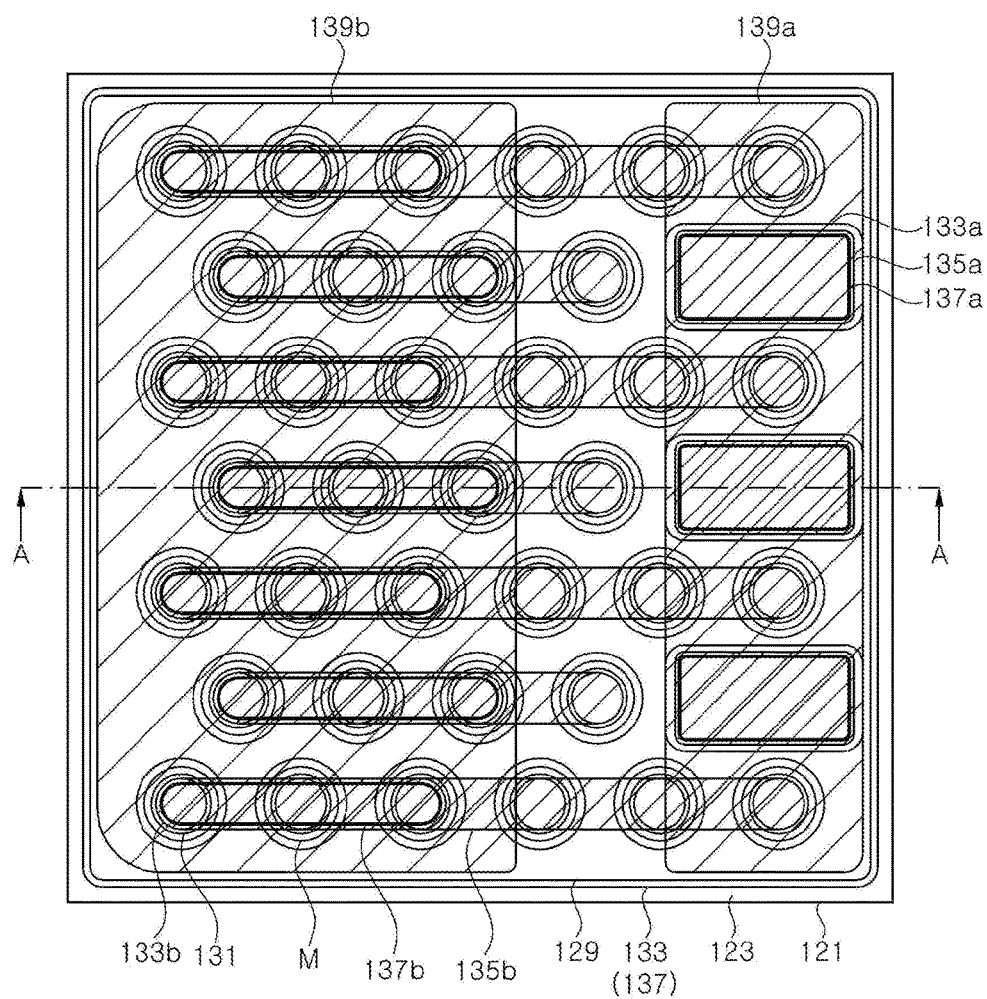
FIG. 1 is a plan view illustrating an ultraviolet light emitting diode according to an exemplary embodiment of the disclosed technology.

Hereinafter, exemplary embodiments of the disclosed technology will be described in detail with reference to the accompanying drawings. The following exemplary embodiments are provided by way of example so as to facilitate the understanding of the disclosed technology to those skilled in the art to which the disclosed technology pertains. Accordingly, the disclosed technology is not limited to the embodiments disclosed herein, and can also be implemented in different forms. Also, it will be understood that, when an element is referred to as being "disposed over" or "disposed on" another element, it can be directly "disposed over" or "disposed on" the other element, or intervening elements may be present. Throughout the specification, like numerals denote like elements.

The disclosed technology provides a light emitting device with improved characteristics. Conventional deep ultraviolet light emitting diodes have a light emitting element disposed on an n-type semiconductor layer. The light emitting element included in the conventional deep ultraviolet light emitting diodes is different from those of the general blue light emitting diode or the near ultraviolet light emitting diode in terms of its shape and position. The light emitting element is formed toward one side of the ultraviolet light emitting diode from a center of the n-type semiconductor layer, a p-bump is disposed on the light emitting element, and an n-bump is disposed near the other side of the ultraviolet light emitting diode that is opposite to the one side and spaced apart from the light emitting element. The n-bump is usually disposed away from the light emitting element, and thus the n-bump is formed in a relatively narrow region compared to the p-bump. Further, conventional ultraviolet light emitting diodes are bonded to a submount using a thermal sonic (TS) bonding technique. For TS bonding, the upper surfaces of the n-bump and the p-bump need to have a same height, and, for this, a step adjustment layer is disposed under the n-bump.

These conventional UV light emitting diodes generally have disadvantages that a light output is low and a forward voltage is high. Since a p-type semiconductor layer includes a p-type GaN layer for an ohmic contact, ultraviolet light incident into the p-type semiconductor layer is absorbed and lost in the p-type semiconductor layer. In addition, since an n-type ohmic contact layer bonded to an n-type semiconductor layer also absorbs light, light traveling into the n-typeohmic contact layer is absorbed and lost in the n-type ohmic contact layer. In the case of the blue light emitting diode, light loss is reduced by employing a reflective metal layer in the n-type ohmic contact layer. Unlike the blue light emitting diode, in deep ultraviolet light emitting diodes, it is difficult to form an n-type ohmic contact layer with a reflective metal layer. In addition, the n-type ohmic contact layer occupies a considerably wide area, light loss by the n-type ohmic contact layer becomes a serious problem.

Furthermore, the conventional ultraviolet light emitting diode has a structure to limit the use of light emitted from a side of the light emitting element, and thus there have been efforts to reduce a side area of the light emitting element as much as possible. Thus, a width of the light emitting element is formed to be relatively wide. However, as the width of the light emitting element becomes larger, a distance from the n-type ohmic contact layer to the central region of the light emitting element becomes greater, and thus undesirable effects, for example, reducing current spreading and increasing a forward voltage have been caused.

The disclosed technology provides a ultraviolet light emitting diode which can address the above-mentioned problems of the conventional ultraviolet light emitting diode and provide improved electrical characteristics. Nitride-based semiconductor layers described below may be grown by using various methods commonly known to those skilled in the art, for example, by methods of MOCVD (Metal Organic Chemical Vapor Deposition), MBE (Molecular Beam Epitaxy), HVPE (Hydride Vapor Phase Epitaxy), or others. In exemplary embodiments described below, it is described that semiconductor layers are grown in a growth chamber using MOCVD. In growth processes of nitride-based semiconductor layers, for sources flowing into a growth chamber, generally known sources may be used. For example, TMGa, TEGa, or others may be used as a Ga source, TMAl, TEAl, or others may be used as an Al source, TMIn, TEIn, or others may be used as an In source, and $NH_3$ may be used as an N source. However, the disclosed technology is not limited thereto.

An ultraviolet light emitting diode according to an exemplary embodiment of the disclosed technology comprises a substrate; an n-type semiconductor layer disposed on the substrate; micro light emitting elements disposed on the n-type semiconductor layer and each comprising an active layer and a p-type semiconductor layer; an n ohmic contact layer contacting the n-type semiconductor layer around the micro light emitting elements; p ohmic contact layers contacting the p-type semiconductor layers of the micro light emitting elements, respectively; an n-bump electrically connecting to the n ohmic contact layer; and a p-bump electrically connected to the p ohmic contact layers of the micro light emitting elements, wherein each of the n-bump and the p-bump is disposed across over a plurality of micro light emitting elements.

Conventional ultraviolet light emitting diodes have some limitations to reflect light emitted from a side of a micro light emitting element since a p-bump is disposed over the micro light emitting element and an n-bump is spaced apart from the micro light emitting element. In the exemplary embodiments of the disclosed technology, sides of micro light emitting elements may be covered with the p-bump and the n-bump, and thus the n-bump and the p-bump may reflect ultraviolet light emitted from the sides of the micro light emitting elements toward the substrate, therefore light loss may be reduced. In addition, since the n-bump and the p-bump are arranged to be overlapped with the micro light emitting elements, sizes of the n-bump and the p-bump may be increased, and hence the heat dissipation characteristics of a light emitting diode may be improved.

Further, by employing the micro light emitting elements and placing the n-type ohmic contact layer around the micro light emitting elements, currents across the entire area of the micro light emitting elements may easily be spread, thus light output may be improved and a forward voltage may be lowered. In addition, since the n-bump and the p-bump are disposed across over the micro light emitting elements, the micro light emitting elements may be arranged across a wide area of the substrate, and the n-bump and the p-bump may be formed relatively widely.

In the meantime, the ultraviolet light emitting diode may further comprise a lower insulating layer covering the micro light emitting elements and the n-type semiconductor layer. The lower insulating layer may comprise at least one first opening exposing the n-type ohmic contact layer and second openings exposing p-type ohmic contact layers on the micro light emitting elements, respectively. The n-bump is electrically connected to the n-type ohmic contact layer via the at least one first opening, and the p-bump is electrically connected to the p-type ohmic contact layers via the second openings. Furthermore, at least a portion of the at least one first opening may be disposed between the micro light emitting elements.

By disposing a portion of the first opening of the lower insulating layer between the micro light emitting elements, a current path can be reduced and a forward voltage can be lowered.

In some exemplary embodiments, the portion of the at least one first opening may be disposed between the micro light emitting elements and the other portion may be disposed outside of the micro light emitting elements.

In some exemplary embodiments, the at least one first opening may comprise a plurality of first openings, wherein only portions of the plurality of first openings may be disposed between the micro light emitting elements, respectively. Other portions of the plurality of first openings are disposed outside of the micro light emitting elements.

The ultraviolet light emitting diode may further comprise at least one p-connection metal layer for electrically connecting the p-type ohmic contact layers exposed via the second openings of the lower insulating layer to each other; and an upper insulating layer covering the p-connection metal layer, wherein the upper insulating layer may comprise at least one second opening exposing the at least one p-connection metal layer, and wherein the p-bump may be electrically connected to the at least one p-connection metal layer via the at least one second opening.

By adopting the upper insulating layer, the micro light emitting elements and the p-connection metal layers may be insulated from the n-bump.

The ultraviolet light emitting diode may further comprise at least one n-pad metal layer formed of the same material as the p-connection metal layer and electrically connected to the n-type ohmic contact layer exposed to the at least one first opening of the lower insulating layer, wherein the upper insulating layer may have at least one first opening exposing the at least one n-pad metal layer, and the n-bump may be connected to the at least one n-pad metal layer via the at least one first opening of the upper insulating layer.

The n-pad metal layer may be formed together of the same material in the same process as the p-connection metal layer and thus may be disposed at the same level.

In the meantime, the first opening of the upper insulating layer may be overlapped with the first opening of the lower insulating layer. Further, the n-pad metal layer and the first opening of the upper insulating layer may be disposed within a region over the first opening of the lower insulating layer.

Further, a portion of the n-bump may be overlapped with a portion of the p-connection metal layer.

In some exemplary embodiments, the lower insulating layer may have a single first opening, and the upper insulating layer may have a plurality of first openings disposed on the one first opening.

In some exemplary embodiments, the at least one second opening of the upper insulating layer may comprise a plurality of second openings formed across over the plurality of micro light emitting elements.

In other exemplary embodiments, the at least one second opening of the upper insulating layer may comprise a plurality of second openings limitedly disposed over the micro light emitting elements, respectively.

In the meantime, the p-connection metal layer may comprise a metal reflective layer. The at least one p-connection metal layer may cover sides of the micro light emitting elements. Therefore, light traveling to the sides of the micro light emitting elements may be reflected by the p-connection metal layer, and light output of the light emitting diode may be improved.

In one exemplary embodiment, the at least one p-connection metal layer may be a continuous layer covering all of the micro light emitting elements. In relation to this, sides of the micro light emitting elements may be covered with the p-connection metal layer, thus light output may be maximized.

In other exemplary embodiments, the at least one p-connection metal layer may comprise a plurality of linear p-connection metal layers, and the plurality of p-connection metal layers may be electrically connected to one another by the p-bump.

In the meantime, the ultraviolet light emitting diode may further comprise an antireflection film disposed on the substrate. A light extraction efficiency may be improved by using the antireflection film.

A horizontal cross-section of the micro light emitting element may not be limited to a specific shape, for example, it may be circular or hexagonal.

Hereinafter, exemplary embodiments of the disclosed technology will be described in detail with reference to the drawings.

Figure 2:
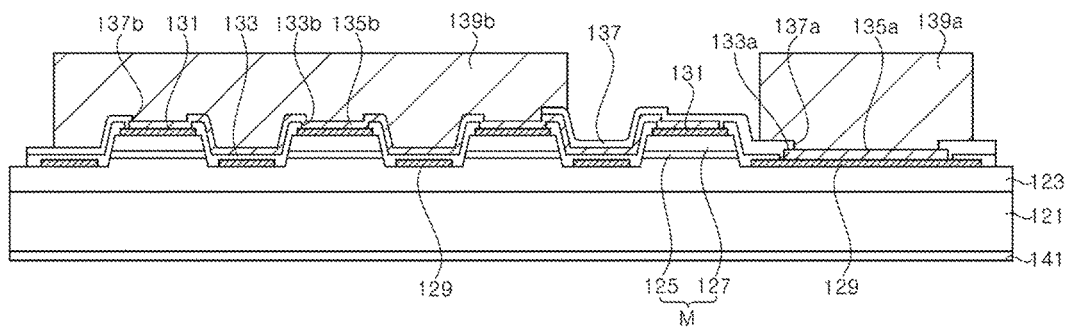
FIG. 2 is a cross-sectional view taken along the line A-A in FIG. 1.

FIG. 1 is a schematic plan view illustrating an ultraviolet light emitting diode according to the one exemplary embodiment, and FIG. 2 is a cross sectional view taken along the line A-A in FIG. 1.

Referring to FIGS. 1 and 2, the ultraviolet light emitting diode according to the present exemplary embodiment comprises a substrate 121, an n-type semiconductor layer 123, a micro light emitting element M, an n-type ohmic contact layer 129, a p-type ohmic contact layer 131, a lower insulating layer 133, an n-pad metal layer 135a, a p-connection metal layer 135b, an upper insulating layer 137, an n-bump 139a, a p-bump 139b, and an antireflection layer 141. The micro light emitting element M comprises an active layer 125 and a p-type semiconductor layer 127.

The substrate 121 is capable of growing a nitride-based semiconductor, for example, it may comprise a heterogeneous substrate such as a sapphire substrate, a silicon substrate, a silicon carbide substrate, a spinel substrate or others, or it may comprise a homogeneous substrate such as an gallium nitride substrate, an aluminum nitride substrate, or others.

The n-type semiconductor layer 123 is disposed on the substrate 121. The n-type semiconductor layer 123 may comprise, for example, an AlN buffer layer and an n-type AlGaN layer. In some implementation, the AlN buffer layer may have a thickness about 3.79 µm. The n-type AlGaN layer may comprise a lower n-type AlGaN layer having a mole ratio of Al of 0.8 or more, an intermediate AlGaN layer having an Al mole ratio of 0.7 to 0.8, and an upper n-type AlGaN layer having a thickness of 66.5 nm. In some implementations, the lower n-type AlGaN layer may have a thickness about 2.15 µm. In some implementations, the intermediate AlGaN layer may have a thickness about 1.7 nm. The n-type semiconductor layer 123 includes a nitride-based semiconductor having a band gap wider than that of an active layer so as to transmit light generated in the active layer. In the case where a gallium nitride based semiconductor layer is grown on a sapphire substrate 121, the n type semiconductor layer 123 may usually comprise a plurality of layers so as to improve crystalline quality.

The micro light emitting element M is disposed on the n-type semiconductor layer 123. The micro light emitting element M comprises the active layer 125 and the p-type semiconductor layer 127. In general, after sequentially growing the n-type semiconductor layer 123, the active layer 125, and the p-type semiconductor layer 127, the micro light emitting elements Ms are formed by patterning the p-type semiconductor layer 127 and the active layer 125. The micro light emitting element M may comprise a portion of the n-type semiconductor layer 123.

The active layer 125 may be a single quantum well structure or a multiple quantum well structure comprising well layers and barrier layers. The well layer may be formed of or include AlGaN or AlInGaN, and the barrier layer may be formed of or include AlGaN or AlInGaN having a wider band gap than that of the well layer. For example, each well layer may be formed of or include AlGaN having a mole ratio of Al of about 0.5 with a thickness of about 3.1 nm, and each barrier layer may be formed of AlGaN having a mole ratio of Al of 0.7 or more with a thickness of about 9 nm or more. In some implementations, a first barrier layer, which is the closest to the n-type semiconductor layer 123, may be formed thicker than other barrier layers with a thickness of 12 nm or more. In the meantime, AlGaN layers having an Al mole ratio of 0.7 to 0.8 may be disposed in contact with upper and lower portions of each well layer with a thickness of about 1 nm, respectively. However, an Al mole ratio of the AlGaN layer contacting a last well layer, which is the closest to the p-type semiconductor layer 127, may be 0.8 or more in consideration of contacting an electron blocking layer.

In some implementations, the p-type semiconductor layer 127 may comprise an electron blocking layer and a p-type GaN contact layer. The electron blocking layer prevents electrons from overflowing from an active layer to the p-type semiconductor layer 127, and thus, recombination rate of electrons and holes is improved. The electron blocking layer may be formed of or include, for example, p-type AlGaN having a mole ratio of Al of about 0.8, and may be formed with a thickness of, for example, 55 nm. In some implementations, the p-type GaN contact layer may be formed to a thickness of about 300 nm.

The micro light emitting elements Ms may be arranged in various shapes on the n-type semiconductor layer 123. As shown in FIG. 1, the micro light emitting elements Ms may be arranged in various manners. For example, the micro light emitting elements Ms may be arranged in a high density hexagonal close-packed (HCP) structure, but is not limited thereto. In some implementations, several micro light emitting elements Ms may be omitted from some sites of the HCP structure of the micro light emitting elements Ms.

Although a horizontal cross section of the micro light emitting elements Ms may be circular, it is not limited thereto, and it may have various shapes such as a square shape, a pentagonal shape, a hexagonal shape, or others. Each micro light emitting element M may have a truncated shape and have a side surface inclined at an angle of 90 degrees or less with respect to an upper surface of the substrate 121 or the n-type semiconductor layer 123. A maximum width of the micro light emitting element M may be more than 10 μm and less than 100 μm, or further may be more than 20 μm and less than 50 μm. By limiting a width of the micro light emitting element M to a microscale, currents may be easily spread across the entire area of the micro light emitting element M. In addition, since the micro light emitting element M has a relatively small width light loss occurred when light generated inside the micro light emitting element M moves inside the micro light emitting element M may be reduced.

Referring again to FIGS. 1 and 2, the n-type ohmic contact layer 129 is disposed on the n-type semiconductor layer 123 exposed around the micro light emitting elements Ms. After depositing a plurality of metal layers, the n-type ohmic contact layer 129 may be formed by alloying these metal layers via a rapid thermal alloy (RTA) process. For example, the n-type ohmic contact layer 129 can be formed by depositing Cr/Ti/Al/Ti/Au sequentially and then alloying these metal layers via the RTA process, for example, at 935° C., within several seconds or within several tens of seconds. Therefore, the n-type ohmic contact layer 129 may become an alloy layer containing Cr, Ti, Al and/or Au.

The n-type ohmic contact layer 129 is formed around the micro light emitting element M. In some implementations, the n-type ohmic contact layer 129 surrounds the micro light emitting elements Ms along perimeters of the micro light emitting elements Ms. The n-type ohmic contact layer 129 may be spaced apart from the micro light emitting elements Ms by a distance and may occupy a great area on the n type semiconductor layer 123. The n-type ohmic contact layer 129 is formed around the micro light emitting element M, therefore, there is a region where the n-type ohmic contact layer 129 doesn't exist between the micro light emitting element M and the n-type ohmic contact layer 129. Light emitted from sides of the micro light emitting elements Ms may be incident back into the n-type semiconductor layer 123 through the region and may be emitted to outside via the substrate 121. The separation distance between the n-type ohmic contact layer 129 and the micro light emitting element M may be constant along the periphery of the micro light emitting element M, but it is not necessarily limited thereto.

After forming the n-type ohmic contact layer 129, the p-type ohmic contact layer 131 is formed on each micro light emitting element M. The p-type ohmic contact layer 131 may be formed before forming the n-type ohmic contact layer 129. The p-type ohmic contact layer 131, for example, may be formed at about 590° C. for about 80 seconds via the RTA process after depositing Ni/Au. The p-type ohmic contact layer 131 is in ohmic-contact with the p-type semiconductor layer 127 and covers most of, for example, 80% or more, of an upper region of the micro light emitting element M.

The lower insulating layer 133 covers the micro light emitting elements Ms and further covers the n-type ohmic contact layer 129 and the p-type ohmic contact layer 131. However, the lower insulating layer 133 has a first opening 133a exposing the n-type ohmic contact layer 129 and a second opening 133 B exposing the p-type ohmic contact layer 131.

In FIG. 1, a plurality of first openings 133a is shown, but a single first opening 133a may be formed. A portion of each of the first openings 133a is disposed inside an array of the micro light emitting elements Ms. For this, some of the micro light emitting elements Ms may be omitted. Another portion of each of the first openings 133a may be disposed outside of the array of the micro light emitting elements Ms. That is, as shown in FIG. 1, the first openings 133a are disposed across inside and outside of the array of the micro light emitting elements Ms. A position of the first opening 133a is related to a current path, and a distance of the current path may be shortened by disposing at least a portion of the first opening 133a inside the micro light emitting elements Ms, thus a forward voltage may be reduced. In the meantime, an area where currents are injected may be widened by disposing another portion of the first openings 133a outside of the array of the micro light emitting elements Ms.

The second openings 133b are formed on the micro light emitting elements Ms, respectively, and thus, the same number of the second openings 133b as the micro light emitting elements Ms may be formed. In order to prevent electrical short-circuit, each of the second openings 133b may be limited on a micro light emitting element M so as not to expose the n-type ohmic contact layer 129. However, the disclosed technology is not necessarily limited thereto, and as long as short circuit of a p-connection metal layer 135b described later with the n-type ohmic contact layer 129 is prevented, the second opening 133b may expose a portion of the n-type ohmic contact layer 129, as well as the p-type ohmic contact layer 131.

The n-pad metal layers 135a may be arranged in the first openings 133a. Here, though the n-pad metal layers 135a are shown to be respectively restricted within the first openings 133a, portions of the n-pad metal layers 135a may cover the lower insulating layer 133. Further, the n-pad metal layers 135A may be connected to each other.

A portion of each of the n-pad metal layers 135a may be in contact with the n-type ohmic contact layer 129 inside the array of the micro light emitting elements Ms, and another portion of each of the n-pad metal layers 135a may be in contact with the n-type ohmic contact layer 129 outside the array of the micro light emitting elements Ms. Therefore, a current path in the n-type ohmic contact layer 129 can be shortened, thus a forward voltage can be reduced, and a contact area between the n pad metal layer 135a and the n-type ohmic contact layer 129 can be increased. In some implementations, the n-pad metal layer 135a may be omitted.

In some implementations, p-connection metal layers 135b electrically connect the p-ohmic contact layers 131 exposed by the second openings 133b to one another. As shown in FIG. 1, p-connection metal layers 135b, which are formed in a line shape, may connect micro light emitting elements Ms to one another. In FIG. 1, the micro light emitting elements Ms are arranged in a line shape. As a result, the p-connection metal layers 135b may be parallel to one another. However, the disclosed technology is not limited thereto, and shapes of the p-connection metal layers 135b are not limited to linear, and not limited to connect only linearly arranged micro light emitting elements Ms. The p-connection metal layers 135b may electrically connect the micro light emitting elements Ms to one another in various shapes and various ways.

Micro light emitting elements Ms may be grouped by the p-connection metal layers 135b. That is, the number of the p-connection metal layers 135b is smaller than that of the micro light emitting elements Ms, and each p-connection metal layer 135b may electrically connect a plurality of micro light emitting elements Ms to one another. Therefore, any one of the micro light emitting elements Ms may be electrically connected to any one of the p-connection metal layers 135b.

Since the plurality of the micro light emitting elements Ms is connected by using the p-connection metal layer 135b, each of the p-connection metal layers 135b covers at least a portion of sides of the micro light emitting elements Ms.

In the meantime, the p-connection metal layer 135b may comprise a reflective metal layer, thus, it may reflect light traveling to a side of the micro light emitting element M toward the substrate 121, and thus, light extraction efficiency can be improved. The p-connection metal layer 135b may be formed of or include, for example, Ti layer (300 Å)/Au layer (7000 Å)/Ti layer (50 Å). In addition, in order to further improve a reflectance, the p-connection metal layer 135b may be formed of or include Cr layer/Al layer/Ti layer.

The n-pad metal layer 135a may be formed of the same material and by the same process as the p-connection metal layer 135b, thus, these metal layers 135a and 135b may be disposed at the same level.

As discussed above, a conventional light emitting diode requires a step difference adjustment layer disposed on the n-type ohmic contact layer 129 for thermal ultrasonic bonding, but since exemplary embodiments of the disclosed technology use AuSn bonding or metal sintering paste (Ag, Au) instead of thermal ultrasonic bonding, the step difference adjustment layer is not required. Therefore, the n-pad metal layer 135a may directly contact the n-type ohmic metal layer 129.

The upper insulating layer 137 covers the n-pad metal layers 135a and the p-connection metal layers 135b. However, an upper insulating layer 133 has first openings 137a exposing the n-pad metal layers 135a and second openings 137b exposing the p-connection metal layers 135b. In the implementation shown in FIG. 1, the second opening is structured to expose some of the p-connection metal layers 135b. For example, when the four micro light emitting elements M are formed along a line parallel to a surface of the substrate 121, the p-connection metal layers 135b located on the left three micro light emitting elements Ms are exposed by the second opening 137b but the p-connection metal layer located on the rightmost micro light emitting element is not exposed by the second opening 137b. In FIG. 1, boundary lines of the first openings 137a and the second openings 137b are displayed with bold lines.

The first opening 137a may be disposed on the n-pad metal layer 135a, and may have a smaller area than the n-pad metal layer 135a, but it is not limited thereto. The first opening 137a may be also disposed over the first opening 133a of the lower insulating layer 133 and may have a smaller area than the first opening 133a. As a result, the first opening 133a, the n-pad metal layer 135a, and the first opening 137a are stacked on one another. However, the disclosed technology is not limited thereto, and the first opening 133a and the first opening 137a may be spaced apart from each other so as not to overlap each other.

The second opening 137b may be disposed on the p-connection metal layer 135b, and may have a smaller area than the p-connection metal layer 135b, but it is not limited thereto. One or more second openings 137b may be disposed on each of the p-connection metal layers 135b. The second opening 137b may be disposed across over two or more micro light emitting elements Ms, but it is not necessarily limited thereto, and it may be disposed on one micro light emitting element M.

As shown in FIG. 1, the first openings 137a may be disposed toward one side from the center of the substrate 121, and the second openings 137b may be disposed toward the other side opposite to the one side.

The n-bump 139a covers the first openings 137a and is connected to the n-pad metal layer 135a via the first openings 137a. For example, the n-bump 139a fills in the first openings 137a. The n-bump 139a may seal the first openings 137a. The n-bump 139a is electrically connected to the n-type semiconductor layer 123 via the n-pad metal layer 135a and the n-type ohmic contact layer 129.

The p-bump 139b covers the second openings 137b and is connected to the p-connection metal layer 135b via the second openings 137b. For example, the p-bump 139b fills in the second openings 137b. The p-bump 139b may seal the second openings 137b. The p-bump 139b is electrically connected to the p-type semiconductor layer 127 via the p-connection metal layer 135b and the p-ohmic contact layer 131.

The n-bump 139a and the p-bump 139b may be formed of, for example, Ti/Au/Cr/Au. Alternatively, the n-bump 139a and the p-bump 139b may comprise an Al layer, and may be formed of, for example, Cr/Al/Cr/Au.

As shown in FIG. 1, the n-bump 139a and the p-bump 139b may be disposed in parallel to each other. The first and second openings 137a and 137b may be blocked by the n-bump 139a and the p-bump 139b, therefore moisture or the like from an outside may be prevented from penetrating the first and second openings 137a and 137b, thus reliability is improved.

Meanwhile, each of the n-bump 139a and the p-bump 139b covers sides of some of the micro light emitting elements Ms. As shown in FIG. 1, the p-bump 139b is disposed across over a plurality of micro light emitting elements Ms and the n-bump 139a is also disposed across over a plurality of micro light emitting elements Ms. Thus, a size of the n-bump 139a may be increased. An increase in the size of the n-bump 139a improves heat dissipation characteristics of the light emitting diode. Further, since the n-bump 139a is disposed across over the micro light emitting elements Ms, heat generated at the micro light emitting elements Ms may be easily externally released by using the n-bump 139a.

The n-bump 139a and the p-bump 139b have a reflectance to ultraviolet light, therefore light emitted to the side of the micro light emitting element M may be reflected and incident back inside the micro light emitting element M. Therefore, it is possible to reduce light loss which might be occurred when light generated in the active layer 127 is emitted to the side of the micro light emitting element M.

In some implementations, upper surfaces of the n-bump 139a and the p-bump 139b are shown to be flat in FIG. 2, but they may not be flat due to difference in heights between the micro light emitting elements Ms and the n-pad metal layer 135a.

The antireflection layer 141 is disposed on a light emitting side of the substrate 121. The antireflection layer 141 may be formed with a transparent insulating layer such as $SiO_2$, with a thickness of, for example, an integral multiple of ¼ of wavelengths of ultraviolet rays. Alternatively, as the antireflection layer 141, a band-pass filter with repeatedly laminated layers having different refractive indices may be used.

In some implementations, even if it is not shown in the drawing, a side of the substrate 121 may have roughness, thus light extraction efficiency through the side of the substrate 121 can be improved. The roughness may be formed, for example, by dividing the substrate using a stealth laser scribing method.

Figure 3:
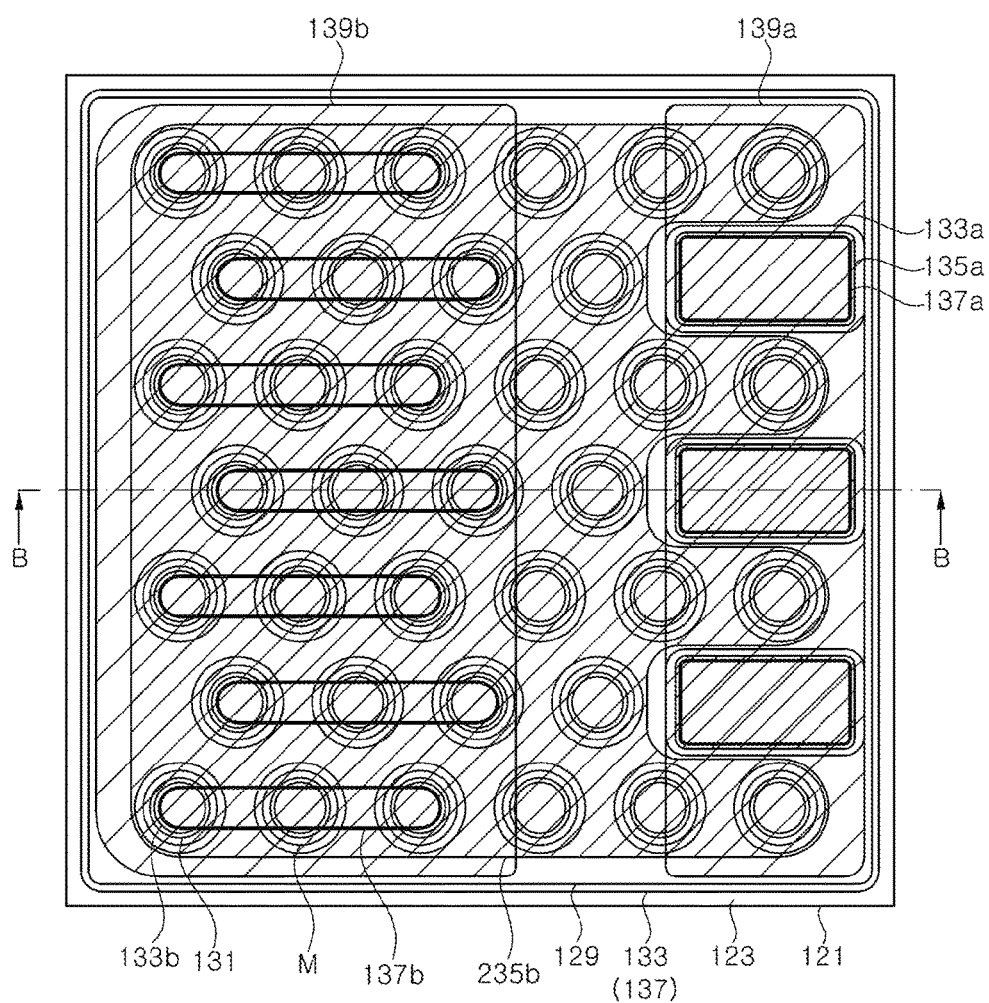
FIG. 3 is a schematic plan view illustrating an ultraviolet light emitting diode according to another exemplary embodiment of the disclosed technology.
Figure 4:
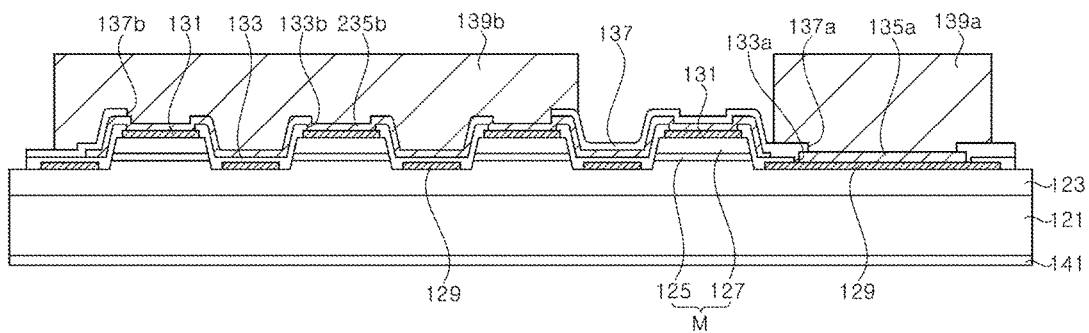
FIG. 4 is a cross-sectional view taken along the line B-B in FIG. 3.

FIG. 3 is a schematic plan view illustrating an ultraviolet light emitting diode according to another exemplary embodiment of the disclosed technology, FIG. 4 is a cross sectional view taken along a line B-B in FIG. 3.

Referring to FIGS. 3 and 4, the light emitting diode according to this exemplary embodiment is substantially the same as the light emitting diode described above, but there is a difference that a single p-connection metal layer 235*b* connects all of the p-ohmic contact layers 131 one another.

The p-connection metal layer 235*b* covers all of the micro light emitting elements M disposed on the substrate 121 and connects the p-type ohmic contact layer 131 disposed thereon. The p-connection metal layer 235*b* may also cover all of sides of the micro light emitting elements Ms. The p-connection metal layer 235*b* has a great size than the p-connection metal layer 135*b* in FIGS. 1 and 2.

Since the p-connection metal layer 235*b* covers all of the sides of the micro light emitting elements Ms, reflection to ultraviolet light on the sides of the micro light emitting elements M can be performed by the p-connection metal layer 235*b*. Thus, the p-bump 139*b* may be formed of materials suitable for the bump without considering a reflection characteristic.

In this present exemplary embodiment, the second openings 137*b* of the upper insulating layer 137 are shown at the same position as the exemplary embodiment of FIG. 1, but shapes and positions of the second openings 137*b* may vary, further, a single second opening 137*b* may be formed.

Figure 5:
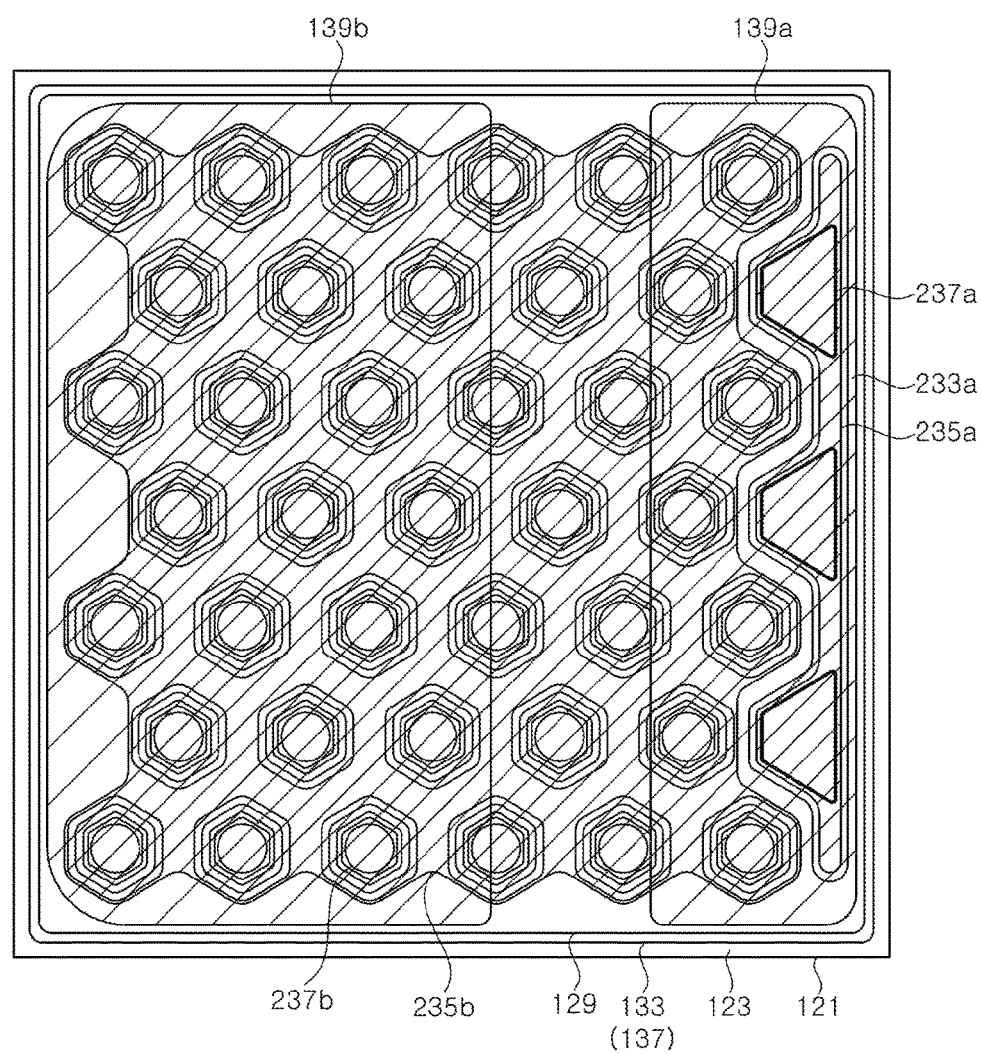
FIG. 5 is a schematic plan view illustrating an ultraviolet light emitting diode according to another exemplary embodiment of the disclosed technology.

FIG. 5 is a schematic plan view illustrating an ultraviolet light emitting diode according to another exemplary embodiment of the disclosed technology.

Referring to FIG. 5, the ultraviolet light emitting diode according to the present exemplary embodiment is substantially the same as the ultraviolet light emitting diode described with reference to FIGS. 1 and 2, but shapes of the micro light emitting elements Ms, a shape of a first opening 233*a* of the lower insulating layer 137, a shape of an n-pad metal layer 235A, a shape of the p-connection metal layer 235*b*, shapes of a first opening 237*a* and a second opening 237*b* of the upper insulating layer 137 are different from those in the previous exemplary embodiment.

First, the micro light emitting elements Ms have a shape of a regular hexagon. The regular hexagonal shape is suitable for a honeycomb arrangement of the micro light emitting elements Ms. However, the disclosed technology is not limited to a certain shape of the micro light emitting element M, and the present exemplary embodiment with the hexagonal shape is one example of possible various shapes of micro light emitting elements Ms.

In some implementations, a single first opening 233*a* is disposed. A portion of the first opening 233*a* is disposed in a region between the micro light emitting elements Ms and another portion of the first opening 233*a* is disposed outside an array of the micro light emitting elements Ms.

The n-pad metal layer 235*a* may be disposed limitedly in the first opening 233*a* and may have a shape substantially similar to the first opening 233*a*. However, the disclosed technology is not limited thereto, and a portion of the n-pad metal layer 235*a* may be disposed on the lower insulating layer 133.

As described above with reference to FIGS. 3 and 4, the p-connection metal layer 235*b* may electrically connect all of the micro light emitting elements Ms.

In some implementations, the first opening 237*a* of the upper insulating layer 137 may expose the n-pad metal layer 235*a* and may be also disposed on the first opening 233*a* of the lower insulating layer 133. As shown in FIG. 5, a plurality of first openings 237*a* may be formed inside the first opening 233*a* of the lower insulating layer 133.

The second openings 237*b* of the upper insulating layer 137 may be disposed limitedly in regions over the micro light emitting elements Ms, respectively. That is, one second opening 237*b* may be disposed on one micro light emitting element M and may not be formed across over a plurality of micro light emitting elements Ms. The second openings 237*b* are disposed under the p-bump 139*a* and are sealed by the p-bump 139*a*.

The ultraviolet light emitting diode according to the present exemplary embodiment may be flip-bonded on a submount substrate. For example, the submount substrate may be an AlN substrate having electrode pads on its upper surface. The ultraviolet light emitting diode may be bonded to the submount substrate by using a bonding technique utilizing metal sintered paste or AuSn. As a result, the elevations of upper surfaces of the n-bump 139*a* and the p-bump 139*b* may not be the same.

The ultraviolet light emitting diode according to this present exemplary embodiment may have a lower forward voltage as compared with a conventional ultraviolet light emitting diode adopting a single mesa and having an n-bump 139*a* spaced away from the mesa, further, loss of light may be reduced and thus light output may be improved.

According to exemplary embodiments of the disclosed technology, sides of most micro light emitting elements may be covered with p-connection metal layers, a p-bump, and an n-bump, and thus ultraviolet light traveling to the sides of the micro light emitting elements may be reflected to a substrate, therefore, loss of light may be reduced. In addition, since the n-bump and the p-bump are disposed to be overlapped with the micro light emitting elements, sizes of the n-bump and the p-bump can be increased, and thus heat dissipation characteristics of the light emitting diodes can be improved. Further, by adopting the micro light emitting elements and placing an n-type ohmic contact layer around the micro light emitting elements, currents across the entire area of the micro light emitting elements can be easily spread, thus light output may be improved and a forward voltage may be lowered. In addition, since the n-bump and the p-bump are disposed over the micro light emitting elements, the micro light emitting elements may be arranged over a wide area of the substrate, and the n-bump and the p-bump may be formed relatively widely.

Various modifications and changes can be made in the exemplary embodiments described herein, and the disclosed technology comprises all the technical ideas according to the appended claims.

We claim:

1. An ultraviolet light emitting diode comprising:
a substrate;
an n-type semiconductor layer disposed on the substrate;
light emitting elements disposed on the n-type semiconductor layer, each light emitting element comprising an active layer and a p-type semiconductor layer;
an n-type ohmic contact layer contacting the n-type semiconductor layer around the light emitting elements;

p-type ohmic contact layers contacting the p-type semiconductor layers of the light emitting elements, respectively;
an n-bump electrically connecting to the n-type ohmic contact layer;
a p-bump electrically connected to the p-type ohmic contact layers of the light emitting elements;
at least one p-connection metal layer electrically connecting the p-type ohmic contact layers that are exposed via the second openings of the lower insulating layer; and
an upper insulating layer covering the p-connection metal layer, and
wherein each of the n-bump and the p-bump is disposed across over a plurality of light emitting elements,
wherein the upper insulating layer comprises at least one second opening exposing the at least one p-connection metal layer, and
wherein the p-bump is electrically connected to the at least one p-connection metal layer via the at least one second opening, and
wherein the at least one p-connection metal layer covers sides of the light emitting elements.

2. The ultraviolet light emitting diode of claim 1, wherein the at least one second opening of the upper insulating layer comprises a plurality of second openings formed across over the light emitting elements.

3. The ultraviolet light emitting diode of claim 1, wherein the at least one second opening of the upper insulating layer comprises a plurality of second openings disposed within an area over the light emitting elements, respectively.

4. The ultraviolet light emitting diode of claim 1, wherein the p-connection metal layer comprises a metal reflective layer.

5. The ultraviolet light emitting diode of claim 1, wherein the at least one p-connection metal layer is a continuous layer covering all of the light emitting elements.

6. The ultraviolet light emitting diode of claim 1, further comprising an antireflection film disposed on the substrate.

7. The ultraviolet light emitting diode of claim 1, wherein the light emitting elements have a horizontal cross-section that is circular or hexagonal.

8. The ultraviolet light emitting diode of claim 1, further comprising:
a lower insulating layer covering the light emitting elements and the n-type semiconductor layer,
wherein the lower insulating layer comprises at least one first opening exposing the n-type ohmic contact layer and second openings exposing the p-type ohmic contact layers on the light emitting elements, respectively,
wherein the n-bump is electrically connected to the n-type ohmic contact layer via the at least one first opening,
wherein the p-bump is electrically connected to the p-type ohmic contact layers via the second openings, and
wherein at least a portion of the at least one first opening is disposed between the light emitting elements.

9. The ultraviolet light emitting diode of claim 8, wherein a portion of the at least one first opening is disposed between the light emitting elements and another portion of the at least one first opening is disposed outside of the light emitting elements.

10. The ultraviolet light emitting diode of claim 8, wherein the at least one first opening comprises a plurality of first openings, and wherein only portions of the plurality of the first openings are disposed between the light emitting elements.

11. The ultraviolet light emitting diode of claim 1, further comprising:
at least one n-pad metal layer formed of the same material as the p-connection metal layer and electrically connected to the n-type ohmic contact layer exposed to the at least one first opening of the lower insulating layer,
wherein the upper insulating layer has at least one first opening exposing the at least one n-pad metal layer, and
wherein the n-bump is connected to the at least one n-pad metal layer via the at least one first opening of the upper insulating layer.

12. The ultraviolet light emitting diode of claim 11, wherein a portion of the n-bump is located over a portion of the p-connection metal layer.

13. The ultraviolet light emitting diode of claim 11, wherein the lower insulating layer has a single first opening, and the upper insulating layer has a plurality of first openings disposed over the single first opening.

14. The ultraviolet light emitting diode of claim 11, wherein the first opening of the upper insulating layer is located over the first opening of the lower insulating layer.

15. The ultraviolet light emitting diode of claim 14, wherein the n-pad metal layer and the first opening of the upper insulating layer are disposed within a region over the first opening of the lower insulating layer.

16. An ultraviolet light emitting diode comprising:
a substrate;
an n-type semiconductor layer disposed on the substrate;
light emitting elements disposed on the n-type semiconductor layer, each light emitting element comprising an active layer and a p-type semiconductor layer;
an n-type ohmic contact layer contacting the n-type semiconductor layer around the light emitting elements;
p-type ohmic contact layers contacting the p-type semiconductor layers of the light emitting elements, respectively;
an n-bump electrically connecting to the n-type ohmic contact layer;
a p-bump electrically connected to the p-type ohmic contact layers of the light emitting elements;
at least one p-connection metal layer electrically connecting the p-type ohmic contact layers that are exposed via the second openings of the lower insulating layer; and
an upper insulating layer covering the p-connection metal layer, and
wherein each of the n-bump and the p-bump is disposed across over a plurality of light emitting elements,
wherein the upper insulating layer comprises at least one second opening exposing the at least one p-connection metal layer,
wherein the p-bump is electrically connected to the at least one p-connection metal layer via the at least one second opening,
wherein the at least one p-connection metal layer comprises a plurality of linear p-connection metal layers, and
the plurality of p-connection metal layers is electrically connected to one another by the p-bump.

* * * * *